US012787679B2

United States Patent

(12) United States Patent
Jang et al.

(10) Patent No.: US 12,787,679 B2
(45) Date of Patent: Nov. 3, 2026

(54) INTEGRATED EXHAUST DUCT AND SUBSTRATE PROCESSING APPARATUS

(71) Applicant: SEMES CO., LTD., Chungcheongnam-do (KR)

(72) Inventors: Joon Hwan Jang, Chungcheongnam-do (KR); Jong Han Kim, Sejong-si (KR); Dong Gyu Lee, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 562 days.

(21) Appl. No.: 18/470,474

(22) Filed: Sep. 20, 2023

(65) Prior Publication Data

US 2024/0203756 A1 Jun. 20, 2024

(30) Foreign Application Priority Data

Dec. 20, 2022 (KR) ........................ 10-2022-0178878
Apr. 6, 2023 (KR) ........................ 10-2023-0045117

(51) Int. Cl.
*H10P 72/00* (2026.01)

(52) U.S. Cl.
CPC ................................ *H10P 72/0402* (2026.01)

(58) Field of Classification Search
CPC . H10P 72/0402; F24F 13/081; F24F 13/0236; F15D 1/04
See application file for complete search history.

(56) References Cited

U.S. PATENT DOCUMENTS 1,827,727 A * 10/1931 Blizard ..................... F15D 1/04 138/37
1,974,109 A * 9/1934 Higley ...................... F15D 1/04 285/134.1
5,531,484 A * 7/1996 Kawano .................. F16L 43/00 285/179.2
6,290,266 B1 * 9/2001 Kawano ................ F16L 43/001 285/125.1

FOREIGN PATENT DOCUMENTS

EP 0594261 A1 * 4/1994 .......... F24F 13/1486
GB 380068 A * 9/1932 ............... F15D 1/04

(Continued)

OTHER PUBLICATIONS

BPC Ventilation video, uploaded to YouTube Aug. 2019, https://www.youtube.com/watch?v=nFcOysiaH_o (Year: 2019).*

(Continued)

*Primary Examiner* — Kenneth Rinehart
*Assistant Examiner* — Haotian Lu
(74) *Attorney, Agent, or Firm* — Carter, DeLuca & Farrell LLP

(57) ABSTRACT

The present disclosure provides an integrated exhaust duct and a substrate processing apparatus.
The integrated exhaust duct according to the present disclosure includes: an integrated duct body having a plurality of exhaust regions and an exhaust hole communicating with the plurality of exhaust regions; and a hole partition wall disposed inside the exhaust hole to divide the exhaust hole so that the plurality of exhaust regions are blocked from communicating with each other by passing through the exhaust hole.

20 Claims, 8 Drawing Sheets

(56) References Cited

FOREIGN PATENT DOCUMENTS

| | | | | | |
|---|---|---|---|---|---|
| JP | 5280141 | B2 | * | 9/2013 | ........... H01L 21/027 |
| KR | 200202381 | Y1 | * | 11/2000 | ................ F24F 7/06 |
| KR | 10-2006-0044945 | A | | 5/2006 | |
| KR | 10-2013-0011927 | A | | 1/2013 | |
| KR | 20130002735 | U | * | 5/2013 | ................ F24F 7/04 |
| KR | 10-2022-0026115 | A | | 3/2022 | |

OTHER PUBLICATIONS

Duct Transition product page, Wayback Machine dated to May 2022, screenshots taken Apr. 2026 https://web.archive.org/web/20220520080007/https://buyductings.com/duct-transition/ (Year: 2026).*
Woodgears website, Wayback Machine dated to Jan. 2022, screenshots taken Apr. 2026 (Year: 2026).*

* cited by examiner

PRIOR ART

PRIOR ART

PRIOR ART

INTEGRATED EXHAUST DUCT AND SUBSTRATE PROCESSING APPARATUS

CROSS-REFERENCE TO RELATED APPLICATION(S)

This application claims benefit of priority to Korean Patent Application No. 10-2022-0178878 and 10-2023-0045117 filed on Dec. 20, 2022, and Apr. 6, 2023, in the Korean Intellectual Property Office, the disclosures of which are incorporated herein by reference in their entirety.

BACKGROUND

1. Field

The present disclosure relates to an integrated exhaust duct in which a plurality of exhaust ducts are connected and a substrate processing apparatus including the same.

2. Description of Related Art

In order to manufacture semiconductor devices or liquid crystal displays, various processes such as photolithography, etching, ashing, ion injection, and thin film deposition may be performed on a substrate. Before or after such a process is performed, a process of cleaning and drying the substrate to remove contaminants and particles generated in each process is performed.

In a process chamber in which a process for the substrate is performed, an exhaust line is configured to form an internal atmosphere. Fumes generated inside the process chamber during the process are discharged externally thereof through the exhaust line.

Meanwhile, as the exhaust line of the process chamber is connected to an exhaust duct, a plurality of exhaust lines formed in a plurality of process chambers are connected to a plurality of exhaust ducts, and in this case, the plurality of exhaust ducts are connected by an integrated exhaust duct and then exhausted.

However, there may be a limitation in that gas particles may collide with each other within the integrated exhaust duct or collides by an internal structure of the duct, resulting in an occurrence of an eddy current, which may increase exhaust pressure loss.

PRIOR ART REFERENCE

Patent Document (Patent Document 1) Korean Laid-open Patent Publication No. 10-2022-0026115

SUMMARY

The present disclosure is configured to address the aforementioned problem, and an aspect of the present disclosure is to provide an integrated exhaust duct and substrate processing apparatus that can minimize a loss of exhaust pressure.

According to an aspect of the present disclosure, an integrated exhaust duct may include: an integrated duct body having a plurality of exhaust regions and an exhaust hole communicating with the plurality of exhaust regions; and a hole partition wall disposed inside the exhaust hole to divide the exhaust hole so that the plurality of exhaust regions are blocked from communicating with each other by passing through the exhaust hole.

The exhaust region may include a plurality of duct connection portions to which a plurality of exhaust ducts are connected, and a common exhaust path formed from the plurality of duct connection portions to the exhaust hole, and in the common exhaust path, an exhaust path partition wall may be disposed so that a plurality of individual exhaust paths are formed from the plurality of duct connection portions to the exhaust hole.

According to an embodiment, an outlet of each of the plurality of duct connection portions may be formed in a direction different from a direction oriented toward the exhaust hole, and the individual exhaust path may be divided into a plurality of portions from the duct connection portion to the exhaust hole, wherein each of the plurality of portions may extend straight, and each of a connection portion between the duct connection portion and the individual exhaust path and a connection portion between the plurality of portions may be bent and a gap angle thereof may be formed to be an obtuse angle.

According to another embodiment, an outlet of each of the plurality of duct connection portions may be formed in a direction different from a direction oriented to the exhaust hole, and the individual exhaust path may be curved from the duct connection portion to the exhaust hole.

The exhaust hole may have an internal side surface inclined toward a center direction of the exhaust hole as it approaches an outlet of the exhaust hole.

An end of the exhaust path partition wall may protrude to an interior of the exhaust hole and may be inclined in a direction, opposite to the outlet of the exhaust hole.

The duct connection portion may be formed so that an inlet thereof is perpendicular to an outlet thereof, and a valve having a guide inclined surface for guiding a direction of gas may be installed in a portion in which the inlet and the outlet of the duct connection portion communicate with each other.

A cross-sectional area of the duct connection portion, a cross-sectional area of the individual exhaust path, and a cross-sectional area of each divided portion of the exhaust hole, through which gas flows in the integrated duct body, may be formed to sequentially increase.

Two exhaust regions may be formed as a set, and the two common exhaust paths of the two exhaust regions may be disposed to correspond to each other with the exhaust hole interposed therebetween.

Meanwhile, according to an aspect of the present disclosure, an integrated exhaust duct may include: an integrated duct body having a plurality of exhaust regions and an exhaust hole communicating with the plurality of exhaust regions; and a hole partition wall disposed inside the exhaust hole to divide the exhaust hole so that a plurality of exhaust regions are blocked from communicating with each other by passing through the exhaust hole, wherein the exhaust region may include a plurality of duct connection portions to which a plurality of exhaust ducts are connected, and a common exhaust path formed from the plurality of duct connection portions to the exhaust hole, and the duct connection portion may have two outlets formed in opposite directions, and the two exhaust holes may be disposed to be spaced apart from each other, wherein the two common exhaust paths for connecting the two outlets and the two exhaust holes may be disposed to correspond to each other with the duct connection portion interposed therebetween.

Furthermore, according to an aspect of the present disclosure, a substrate processing apparatus may include: a plurality of process chambers in which processes are performed on each substrate; a plurality of exhaust ducts connected to a plurality of exhaust lines formed in the plurality of process chambers; and an integrated exhaust duct connected to the plurality of exhaust ducts, wherein the integrated exhaust duct may include: an integrated duct body having a plurality of exhaust regions and an exhaust hole communicating with the plurality of exhaust regions; and a hole partition wall disposed inside the exhaust hole to divide the exhaust hole so that the plurality of exhaust regions are blocked from communicating with each other passing through the exhaust hole, wherein the exhaust region may include a plurality of duct connection portions to which a plurality of exhaust ducts are connected, and a common exhaust path formed from the plurality of duct connection portions to the exhaust hole.

In the present disclosure, since a hole partition wall is configured in an exhaust hole communicating with a plurality of exhaust regions, the plurality of exhaust regions may be blocked from communicating with each other by passing through the exhaust hole, thereby stabilizing the internal pressure while minimizing a loss of exhaust pressure.

Furthermore, in the present disclosure, since an exhaust path partition wall is disposed so that a plurality of individual exhaust paths are formed in a common exhaust of an exhaust region, a plurality of gas currents in a plurality of duct connection portions flow individually in a plurality of individual exhaust paths without joining in a common exhaust path, thereby stabilizing internal pressure while reducing a loss of exhaust pressure.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, preferred example embodiments will be described in detail with reference to the accompanying drawings so that those of ordinary skill in the art may easily implement the present disclosure. However, in describing preferred example embodiments of the present disclosure in detail, when it is determined that a detailed description of related known functions or configurations may unnecessarily obscure the gist of the present disclosure, the detailed description thereof will be omitted. Furthermore, the same reference numbers are used throughout the drawings to refer to the same or similar portions. Furthermore, in the present specification, it may be understood that the expressions such as “on,” “above,” “upper,” “below”, “beneath,” “lower,” and “side,” merely indicated based on drawings, and may actually vary depending on the direction in which the components are disposed.

Furthermore, throughout the specification, the terms “connected to” or “coupled to” are used to designate a connection or coupling of one element to another element and include both a case where an element is “directly connected or coupled to” another element and a case where an element is “indirectly connected or coupled to” another element via still another element. Furthermore, when a certain portion “includes” or “comprises” a certain component, this indicates that other components are not excluded and may be further included unless otherwise noted.

Figure 4:
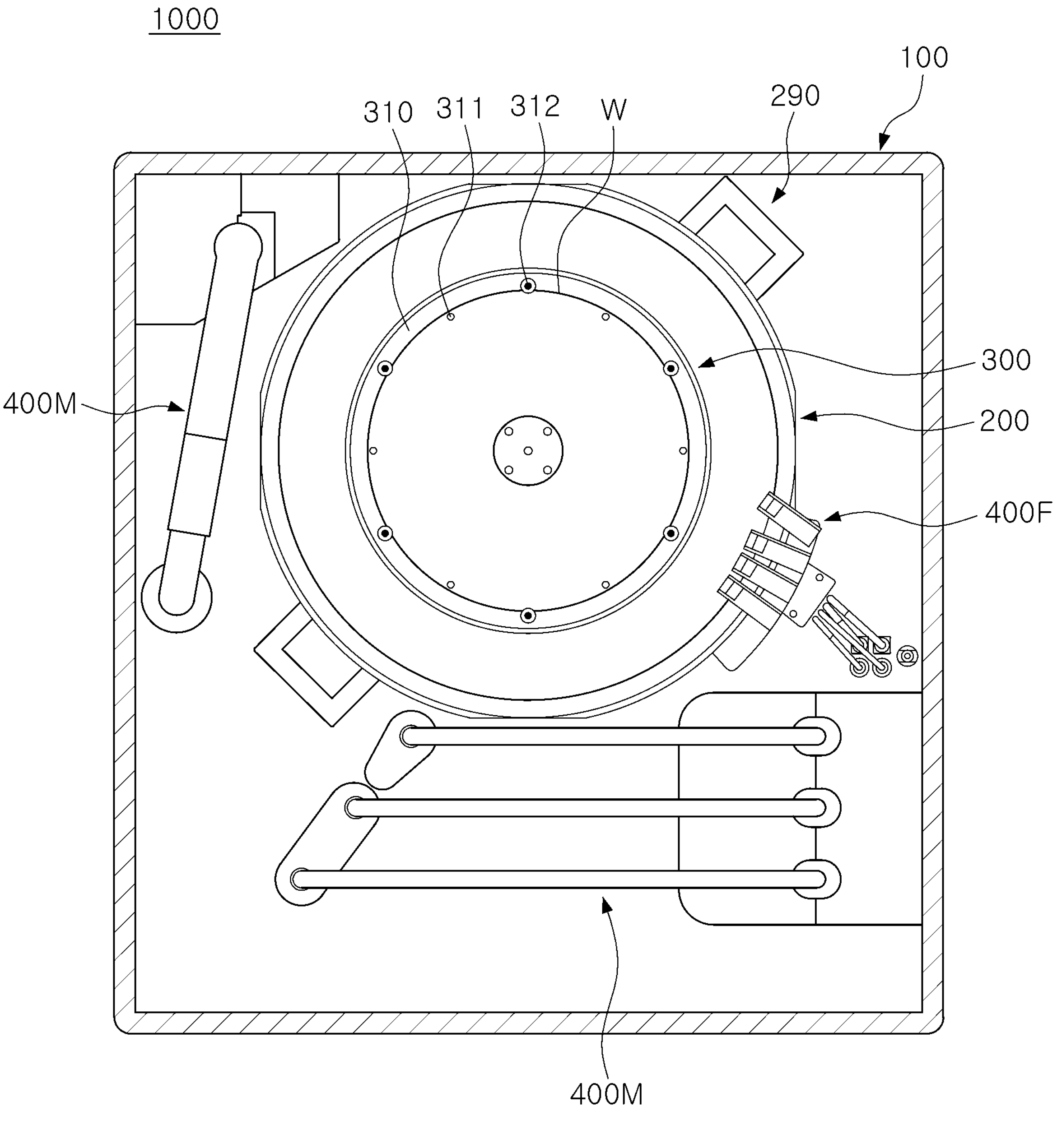
FIG. 4 is a plan view illustrating a process chamber of a substrate processing apparatus according to an embodiment of the present disclosure.
Figure 5:
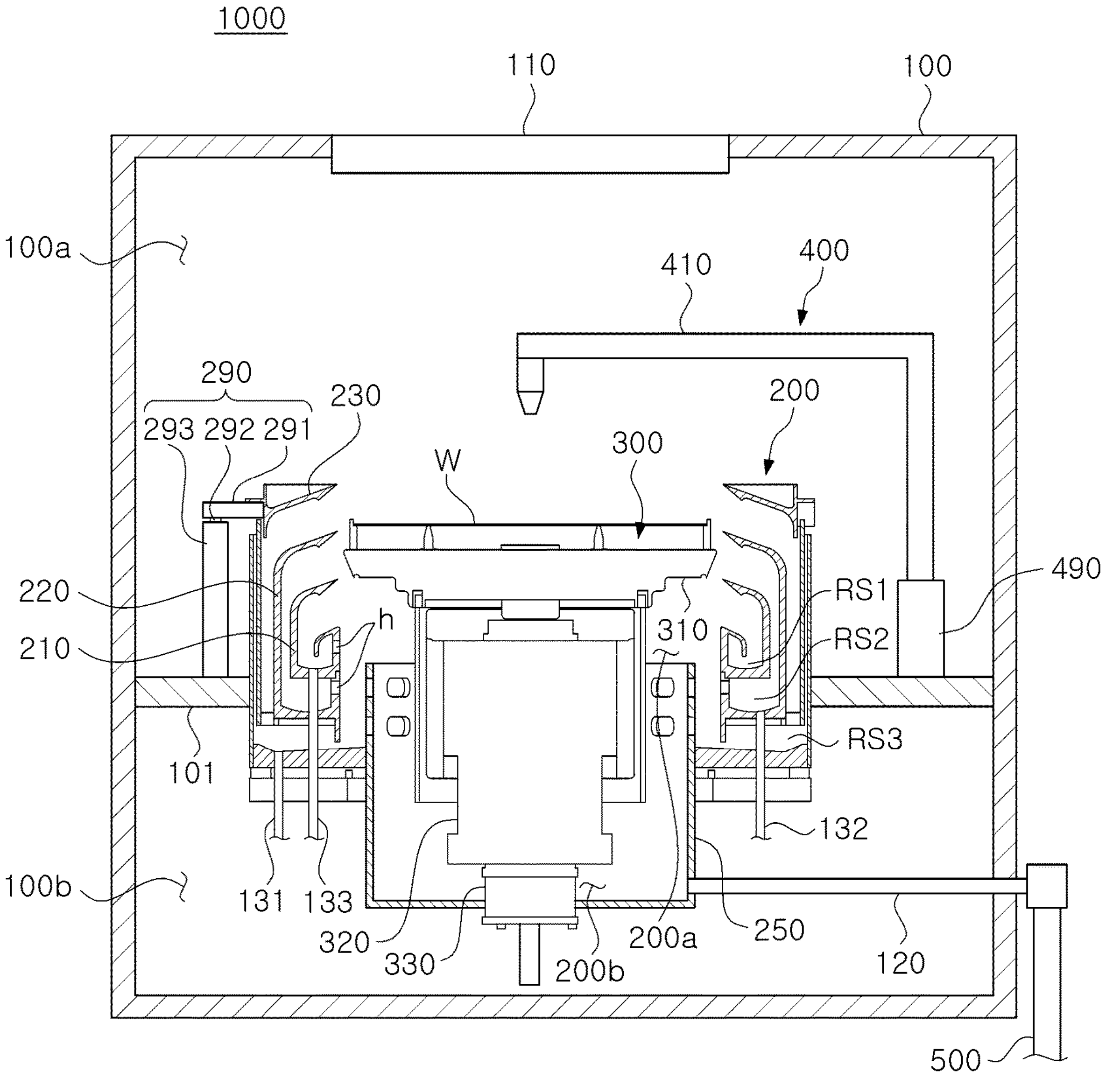
FIG. 5 is a view illustrating an interior of the process chamber of FIG. 4.

FIG. 4 is a plan view illustrating a process chamber of a substrate processing apparatus according to an embodiment of the present disclosure. FIG. 5 is a view illustrating an interior of the process chamber of FIG. 4.

Referring to the drawings, a substrate processing apparatus 1000 of the present disclosure includes a process chamber 100 performing a process on a substrate W with a liquid. In the process chamber 100, the process is performed on the substrate W in a state in which the substrate W is horizontally maintained. The process may be a process of etching a nitride film formed on the substrate W. In this case, the liquid may include phosphoric acid. Furthermore, the process chamber 100 may be used in a process of removing foreign substances and membranes remaining on a surface of the substrate W using various liquids.

Specifically, the process chamber 100 provides a sealed internal space, and a fan filter unit 110 is installed on an upper portion thereof. The fan filter unit 110 generates vertical airflow inside the process chamber 100. The fan filter unit 110 is configured to modularize a filter and an air supply fan into one unit, and filters clean air and supplies the clean air to the process chamber 100. After the clean air passes through the fan filter unit 110, the clean air is supplied to the process chamber 100 to form a vertical airflow. The vertical airflow provides a uniform airflow to an upper portion of the substrate W, and discharges and eliminates pollutants (fumes) generated in a process of processing the surface of the substrate W with a processing fluid, to discharge lines 131, 132 and 133, through bowls 210, 220 and 230 of a processing vessel 200 together with air, thereby maintaining a high level of cleanliness inside a processing container.

The process chamber 100 includes a process region 100*a* and a maintenance region 100*b* partitioned by a horizontal partition wall 101. The horizontal partition wall 101 is equipped with a driving member 293 of an elevating unit 290 and a driving member 490 of a nozzle unit 400. Furthermore, the maintenance region 100*b* is a space in which discharge lines 131, 132 and 133 and an exhaust line 120 connected to a processing container 200 are disposed, and the maintenance region 100*b* may be isolated from the process region 100*a* on which the substrate W is processed.

The substrate processing apparatus 1000 of the present disclosure may include a processing container 200, a support unit 300, and a nozzle unit 400 in a process chamber 100. The processing container 200 is installed inside the process chamber 100, has an upper portion having an open cylindrical shape, and provides a processing space for processing the substrate W. The open upper surface of the processing container 200 is provided as a passage for loading and unloading the substrate W. Here, the support unit 300 is disposed in the processing space. In this case, the support unit 300 supports the substrate W during the process and rotates the substrate W.

Furthermore, the processing container 200 provides an upper space 200*a* in which a spin head 310 of the support unit 300 is disposed, and a lower space 200*b* in which an exhaust collection unit 250 is connected to a lower portion thereof for performing forced exhaust. The exhaust collection unit 250 is connected to an exhaust line 120 extending to the outside of the process chamber 100. In an upper space 200*a* of the processing container 200, annular first, second, and third bowls 210, 220 and 230 for introducing and intaking chemicals and gas scattered on a rotating substrate W are disposed in multiple stages. The first, second, and third bowls 210, 220 and 230 have exhaust ports h communicating with one common annular space (corresponding to the lower space of the processing container).

Here, the first, second, and third bowls 210, 220 and 230 provide first to third recovery spaces RS1, RS2 and RS3 in which airflow including liquids and fumes scattered from the substrate W is introduced. A first recovery space RS1 is formed to be partitioned by the first bowl 210, a second recovery space RS2 is formed as a separation space between the first bowl 210 and the second bowl 220, and the third recovery space RS3 is formed as a separation space between the second bowl 220 and the third bowl 230.

Furthermore, the processing container 200 is coupled to an elevating unit 290 for changing a vertical position of the processing container 200. The elevating unit 290 linearly moves the processing container 200 in a vertical direction. As the processing container 200 is moved up and down, a relative height of the processing container 200 with respect to the spin head 310 is changed. The elevating unit 290 has a bracket 291, a moving shaft 292, and a driving member 293. The bracket 291 is fixedly installed on an external wall of the processing container 200, and the moving shaft 292, which is moved in the vertical direction by the driving member 293, is fixed coupled to the bracket 291. When the substrate W is loaded on the spin head 310 or unloaded from the spin head 310, the processing container 200 is lowered so that the spin head 310 protrudes to an upper portion of the processing container 200.

Furthermore, during the process, a height of the processing container 200 is adjusted so that liquid may flow into predetermined bowls 210, 220 and 230) according to the type of liquid supplied to the substrate W. Accordingly, a relative vertical position between the processing container 200 and the substrate W is changed. Accordingly, the processing container 200 may change the type of liquid and pollutant gas recovered for each recovery space RS1, RS2 and RS3.

The support unit 300 is installed inside the processing container 200. The support unit 300 supports the substrate W during the process and may be rotated by a driving member 330 during the process. Furthermore, the support unit 300 has a spin head 310 having a circular upper surface. A plurality of support pins 311 for supporting the substrate W and a plurality of chucking pins 312 are provided on an upper surface of the spin head 310. A plurality of support pins 311 are spaced apart at regular intervals at an edge portion of the upper surface of the spin head 310 and are disposed in a certain arrangement, and are provided to protrude upwardly from the spin head 310. The support pin 311 supports a lower surface of the substrate W so that the substrate W is supported while being spaced apart from the spin head 310 in an upward direction. Each of the plurality of chucking pins 312 are disposed outside the support pin 311, and the chucking pins 312 are provided to protrude upwardly. The plurality of chucking pins 312 align the substrate W so that the substrate W supported by the plurality of support pins 311 is disposed in a given position on the spin head 310. During the process, the plurality of chucking pins 312 are in contact with a side portion of the substrate W to prevent the substrate W from deviating from the given position. A support shaft 320 for supporting the spin head 310 is connected to a lower portion of the spin head 310, and the support shaft 320 is rotated by the driving member 330 connected to the lower portion thereof. In this case, the driving member 330 is provided with a motor and the like, and with a rotation of the support shaft 320 by the driving member 330, the spin head 310 and the substrate W rotate.

Furthermore, the nozzle unit 400 discharges the liquid to the substrate W supported by the support unit 300. The nozzle unit 400 may be a moving nozzle device 400M or a fixed nozzle device 400F. In this case, a plurality of mobile nozzle devices 400M may be installed outside the processing container 200.

Figure 6:
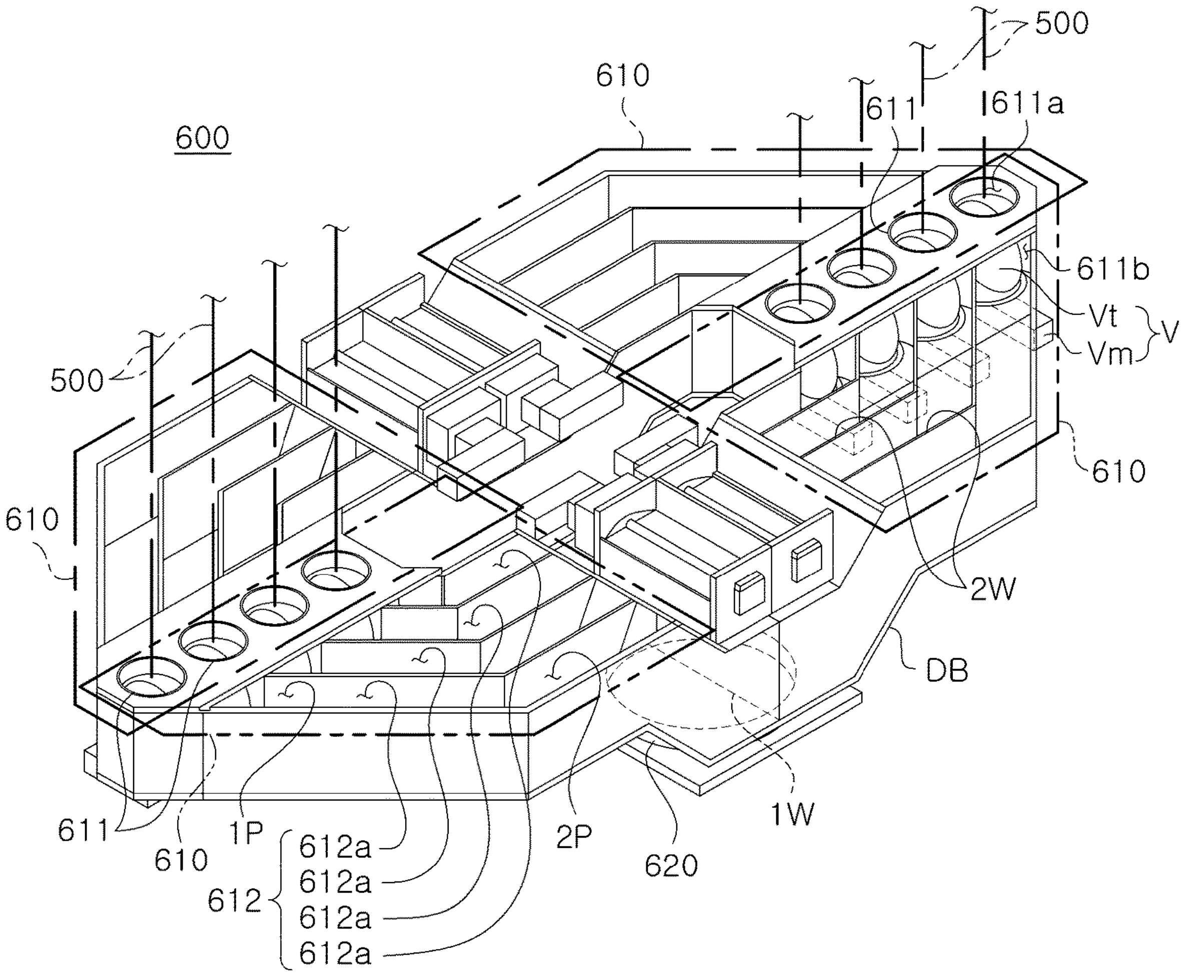
FIG. 6 is a view illustrating an integrated exhaust duct connected to the process chamber of FIG. 5.
Figure 7:
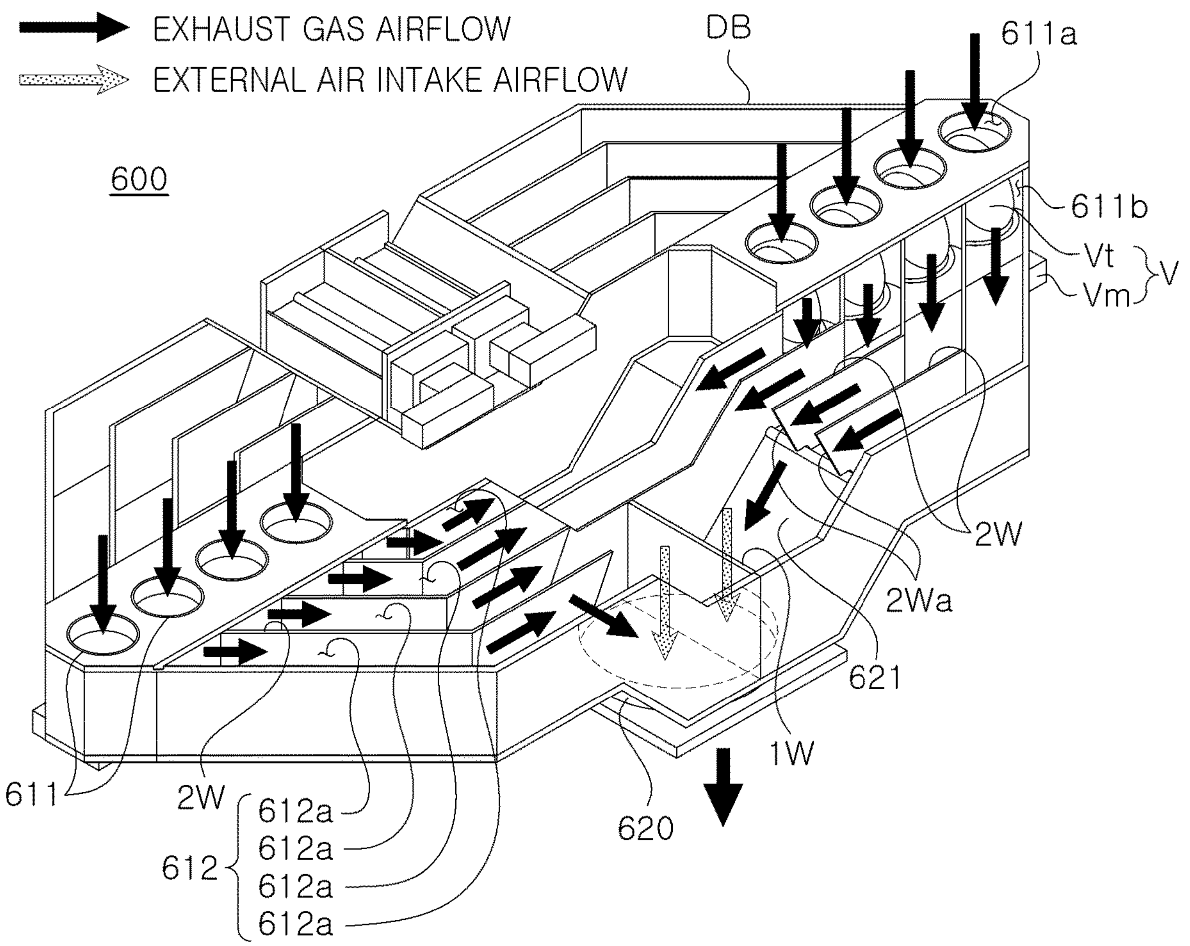
FIG. 7 is a view illustrating a flow direction of gas in the integrated exhaust duct of FIG. 6.
Figure 8:
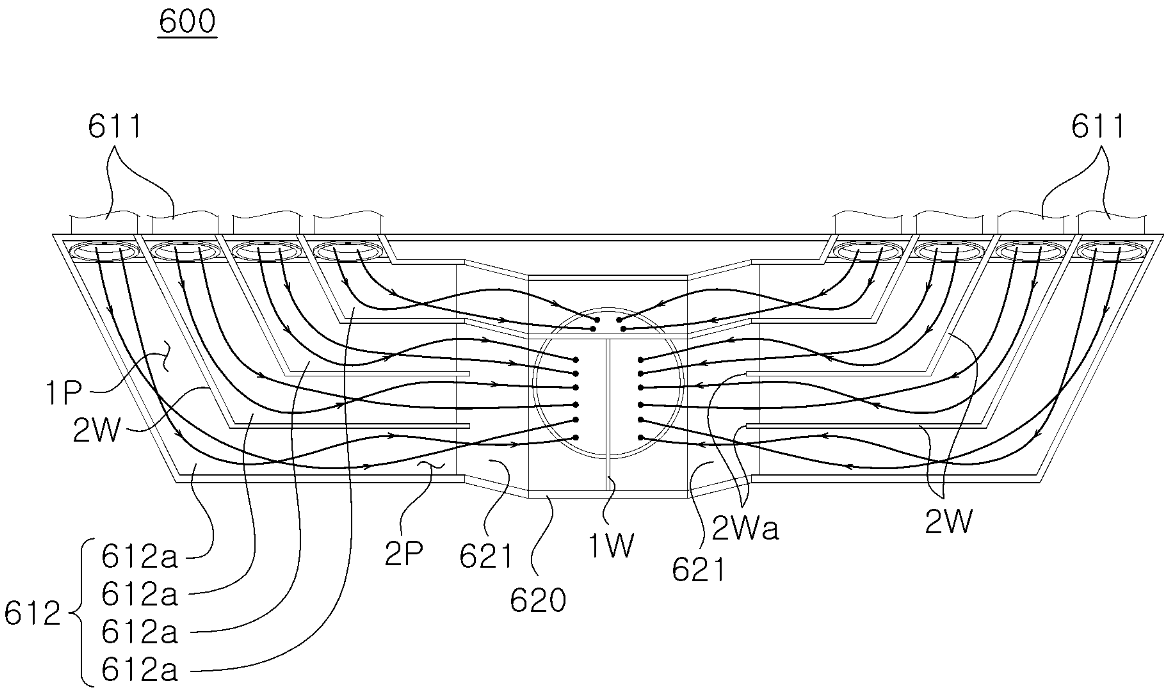
FIG. 8 is a view illustrating a gas flow line in the integrated exhaust duct of FIG. 6.

FIG. 6 is a view illustrating an integrated exhaust duct connected to the process chamber of FIG. 5, FIG. 7 is a view illustrating a flow direction of gas in the integrated exhaust duct of FIG. 6, and FIG. 8 is a view illustrating a flow line of gas in the integrated exhaust duct of FIG. 6.

Referring to the drawings, the substrate processing apparatus 1000 (see FIG. 5) according to an embodiment of the present disclosure includes a plurality of process chambers 100 (see FIG. 5), a plurality of exhaust ducts 500 (see FIGS. 5 and 6), and an integrated exhaust duct 600.

A process chamber 100 may be configured so that a process is performed on a substrate therein, and have an internal structure as illustrated in FIG. 5. That is, the process chamber 100 has an exhaust line 120 formed therein, and when a plurality of process chambers 100 are provided, a plurality of exhaust lines may be provided. For reference, one exhaust line may be formed in one process chamber, and a plurality of exhaust lines may be formed.

Furthermore, an exhaust line 120 of the process chamber 100 is connected to an exhaust duct 500 (see FIG. 5) and when a plurality of exhaust lines are provided, the plurality of exhaust ducts 500 (see FIG. 6) may be provided.

Furthermore, the integrated exhaust duct 600 is connected to the plurality of exhaust ducts 500, and the integrated exhaust duct 600 may minimize a loss of exhaust pressure by arranging an exhaust path partition wall 2W so that a plurality of individual exhaust paths 612*a* are formed in a common exhaust path 612.

Figure 1:
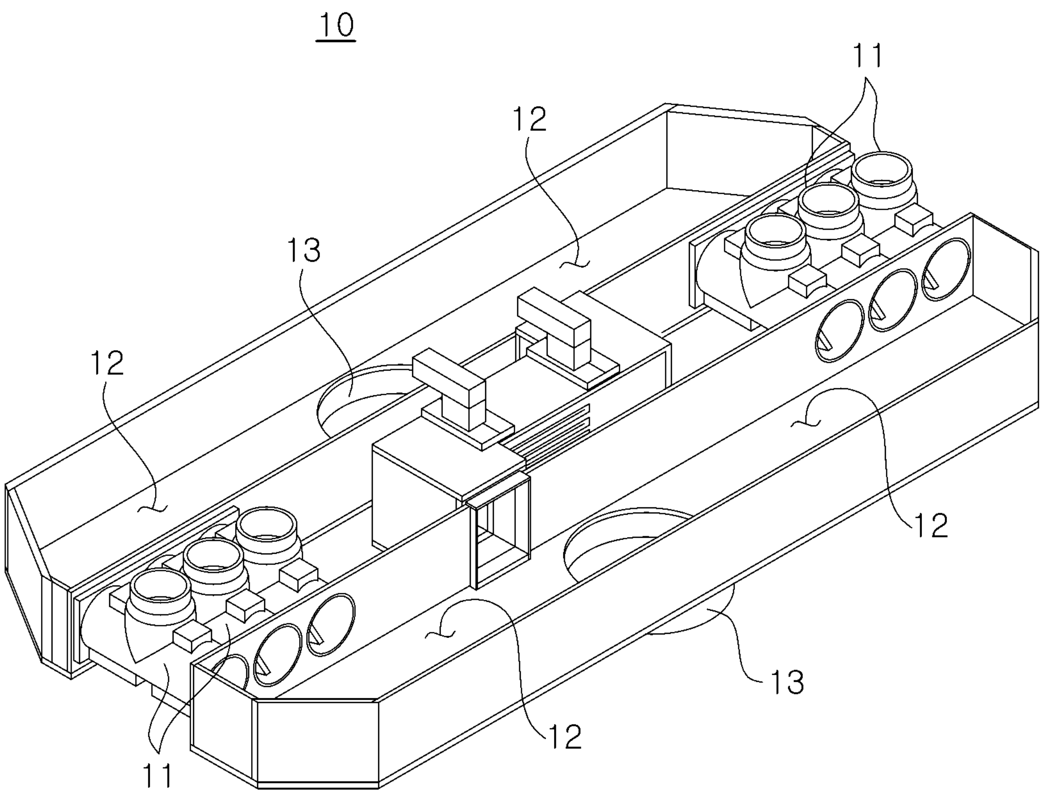
FIG. 1 is a view illustrating an integrated exhaust duct according to the conventional art.
Figure 2:
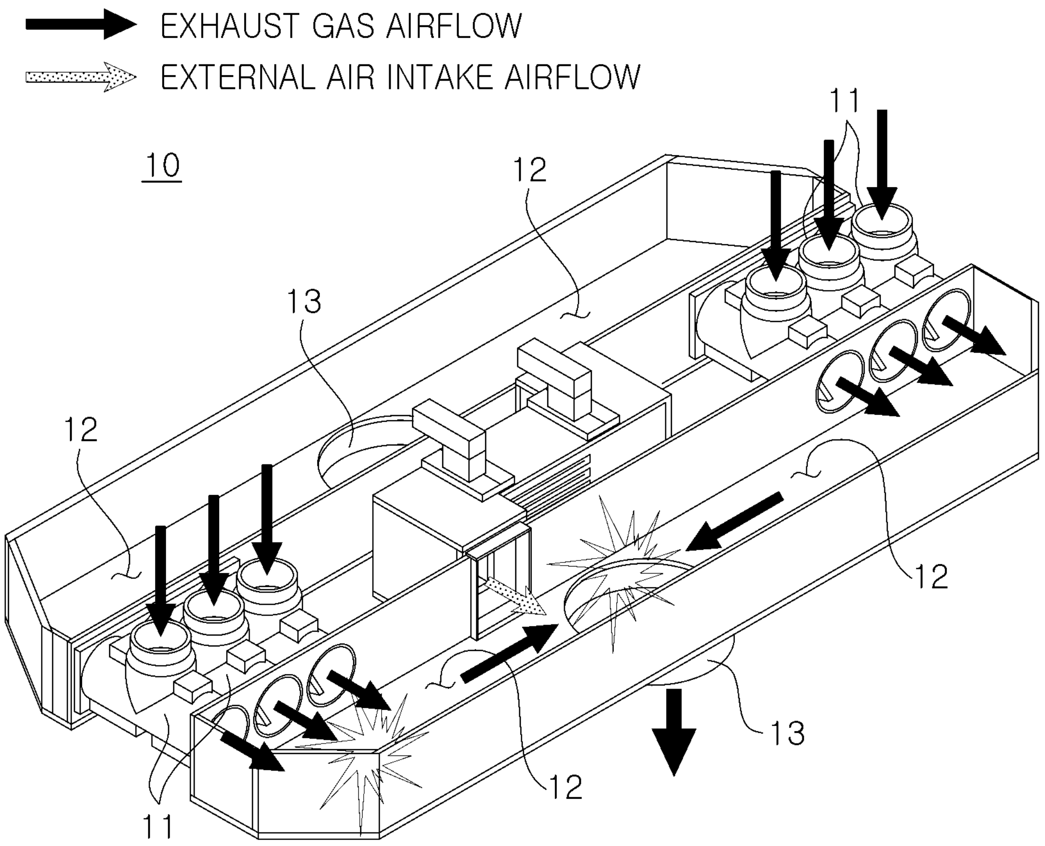
FIG. 2 is a view illustrating a flow direction of gas in the integrated exhaust duct of FIG. 1.
Figure 3:
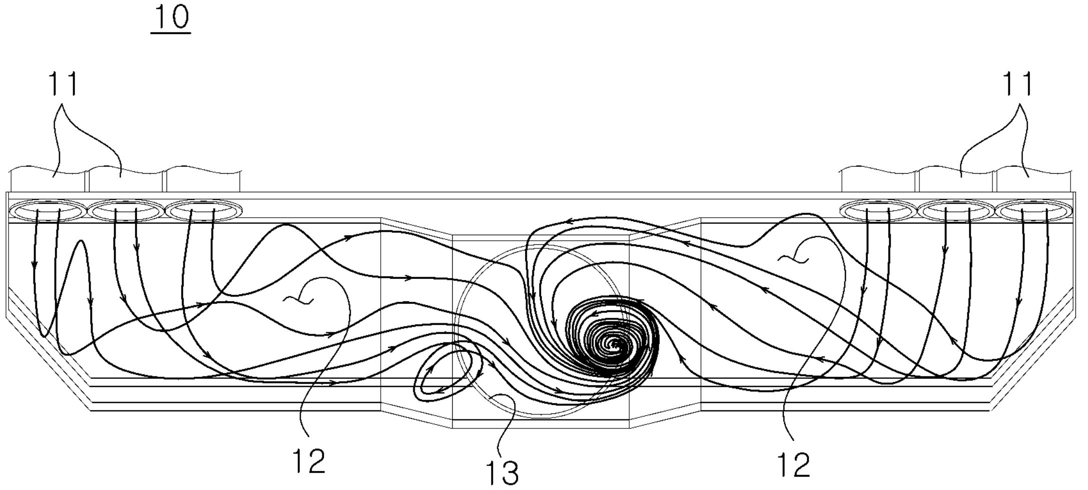
FIG. 3 is a view illustrating a gas flow line in the integrated exhaust duct of FIG. 1.

An integrated exhaust duct 10 according to the conventional art takes the same structure as that of FIGS. 1 to 3, and in the process of combining a plurality of gas airflows in a common exhaust path 12, the plurality of gas airflows may collide with each other, thus significantly causing exhaust pressure loss.

Specifically, in the integrated exhaust duct 10 of the conventional art, a plurality of gas airflows introduced through a plurality of duct connection portions 11 collide with each other when they join in the common exhaust path 12, resulting in an occurrence of an eddy current, as illustrated in FIG. 3, and in this process, a large exhaust pressure loss may be caused.

On the other hand, the integrated exhaust duct 600 according to an embodiment of the present disclosure illustrated in FIGS. 6 to 8 has a plurality of individual exhaust paths 612*a* in the common exhaust path 612 to minimize a loss of exhaust pressure.

The integrated exhaust duct 600 according to an embodiment of the present disclosure includes an integrated duct body DB in which a plurality of exhaust regions 610 and an exhaust hole 620 are formed.

The exhaust region 610 includes a plurality of duct connection portions 611 and a common exhaust path 612.

The duct connection portion 611 is a portion to which the exhaust duct 500 is connected, and as the duct connection portion 611 is provided in a plural form, a plurality of exhaust ducts 500 are connected to the plurality of duct connection portions 611.

Furthermore, the common exhaust path 612 is formed from the plurality of duct connection portions 611 to the exhaust hole 620. In other words, the plurality of duct connection portions 611 are connected to the common exhaust path 612, and accordingly, a plurality of gas airflows introduced through the plurality of duct connection portions 611 join. Furthermore, the common exhaust path 612 is formed from the plurality of duct connection portions 611 to the exhaust hole 620, thus forming a flow path through which the plurality of joined gas airflow flows to the exhaust hole 620.

However, when the plurality of gas airflows join in the common exhaust path 612, they collide with each and cause the eddy current, which may result in a significant loss of the exhaust pressure. To prevent the phenomenon, an exhaust path partition wall 2W is disposed in the common exhaust path 612 of the present disclosure to form a plurality of individual exhaust paths 612*a*.

In other words, the plurality of gas airflows are introduced from the plurality of duct connection portions 611 in the common exhaust path 612, and in order to prevent the plurality of gas airflows from colliding with each other at the time of introducing the plurality of gas airflows and minimize the occurrence of the eddy current, the exhaust path partition wall 2W is disposed so that each of the plurality of gas airflows independently flow from the plurality of duct connection portions 611 to the exhaust hole 620 through the plurality of individual exhaust paths 612*a*.

In other words, in the present disclosure, a plurality of individual exhaust paths 612*a* are formed in the common exhaust path 612 to correspond to each of the plurality of gas airflows, and the exhaust path partition wall 2W is disposed in the common exhaust path 612 to form the plurality of individual exhaust paths 612*a*. For example, as illustrated in the drawing, three exhaust path partition walls 2W may be disposed in order to form four individual exhaust paths 612*a* inside one common exhaust path 612.

Furthermore, the individual exhaust path 612*a* of the present disclosure is configured not to collide vertically with an internal side surface when gas flows, thereby minimizing the loss of the exhaust pressure.

The integrated exhaust duct 10 according to conventional art takes the same structure as that of FIGS. 1 to 3, and the loss of the exhaust pressure may occur significantly because the gas airflows collide vertically with an internal side surface of the common exhaust path 12, resulting in a large exhaust pressure loss.

Specifically, the common exhaust path 12 of the integrated exhaust duct 10 according to the conventional art takes an internal flow path structure in which the gas airflows introduced through the duct connection portion 11 vertically collide with the internal side surface of the common exhaust path 12, resulting in an eddy current, and in this process, the loss of the exhaust pressure may be significantly caused.

On the other hand, the common exhaust path 612 of the integrated exhaust duct 600 according to an embodiment of the present disclosure illustrated in FIGS. 6 to 8 does not have a structure in which the individual exhaust path 612*a* is vertically bent, in order to prevent the large exhaust pressure loss. For this reason, the present disclosure can minimize the exhaust pressure loss by preventing the gas airflows from vertically colliding with an internal side surface of the individual exhaust path 612*a* (a side surface of the exhaust path partition wall 2W or a side surface of an edge wall of the common exhaust path 612) when the gas airflows flow into the individual exhaust path 612*a* from the duct connection portion 611.

The plurality of duct connection portions 611 are spaced apart from each other in a direction away from the exhaust hole 620, and an outlet of each of the plurality of duct connection portions 611 is formed in a different direction from the exhaust hole 620. Under the condition, the individual exhaust path 612*a* does not reach the exhaust hole 620 without changing a direction from an outlet direction of the duct connection portion 611, and accordingly, if the individual exhaust path 612*a* has a vertically bent structure, the large exhaust pressure loss may be caused because the gas airflows vertically collide with the internal side surface of the individual exhaust path 612*a* (the side surface of the exhaust path partition wall 2W or the side surface of the edge wall of the common exhaust path 612).

Accordingly, according to an embodiment, the individual exhaust path 612*a* of the present disposed is divided into a plurality of portions from the duct connection portion 611 to the exhaust hole 620, each of the plurality of portions extends straight, each of a connection portion between the duct connection portion 611 and the individual exhaust path 612*a* and a connection portion between the plurality of portions is bent, and a gap angle thereof is formed to be an obtuse angle. The above-described connection portions may be prevented from being rapidly bent (e.g., a gap angle as an acute angle) or being vertically bent, and accordingly, the gas airflows in the individual exhaust path 612*a* may smoothly flow without the occurrence of the eddy current, thereby minimizing the loss of the exhaust pressure.

As a specific example, as illustrated in the drawing, the individual exhaust path 612*a* may be divided into a first portion 1P and a second portion 2P from the duct connection portion 611 to the exhaust hole 620, and since each of a connection portion between the duct connection portion 611 and the first portion 1P and a connection portion of the first portion 1P and the second portion 2P has a bent structure in which a gap angle thereof is an obtuse angle, the gas airflows may be prevented from vertically colliding with the internal side surface of the individual exhaust path 612*a*, thereby minimizing the loss of the exhaust pressure.

Furthermore, according to another embodiment, although not illustrated in the drawing, the individual exhaust path 612*a* may have a structure which is curved from the duct connection portion 611 to the exhaust hole 620. Accordingly, the loss of the exhaust pressure loss may be minimized by preventing the gas airflows from vertically colliding with the internal side surface of the individual exhaust path 612*a*.

Meanwhile, in the integrated exhaust duct 600 of the present disclosure, a hole partition wall 1W may be disposed in the exhaust hole 620, thereby minimizing the loss of the exhaust pressure.

The integrated exhaust duct 10 according to the conventional art has the same structure as that of FIGS. 1 to 3, and as two exhaust regions 10*a* having the common exhaust path 12 are provided to face each other with the exhaust hole 13 interposed therebetween, the gas airflows flowing from the two exhaust regions 10*a* to the exhaust hole 13 collide with each other, resulting in a large loss of the exhaust pressure.

Specifically, in the integrated exhaust duct 10 of the conventional art, the plurality of gas airflows collide with each other when the gas airflows introduced through the plurality of exhaust regions 10*a* join in the exhaust hole 13, resulting in the large loss of the exhaust pressure in this process.

On the other hand, in the integrated exhaust duct 600 according to an embodiment of the present disclosure illustrated in FIGS. 6 to 8, the hole partition wall 1W is disposed inside the exhaust hole 620 so that the exhaust hole 620 is divided, in order to minimize the loss of the exhaust pressure.

Specifically, in the integrated exhaust duct 600 according to an embodiment of the present disclosure, a plurality of exhaust regions 610 are formed in the integrated exhaust duct 600. In this case, two exhaust regions 610 may be formed as a set, and two common exhaust paths 612 of the two exhaust regions 610 may be disposed to correspond to each other with the exhaust hole 620 interposed therebetween, as illustrated in the drawing. Furthermore, when the duct connection portion 611 has two outlets and the two outlets are formed in opposite directions, two common exhaust paths 612 may be formed in both sides of the duct connection portion 611 by including the duct connection portion 611 in common, thereby forming a total of four exhaust regions 610 as shown in the drawings.

In the integrated exhaust duct 600, the hole partition wall 1W is disposed inside the exhaust hole 620 so that the exhaust hole 620 is divided, in order to prevent the plurality of exhaust regions 610 from communicating with each other by passing through the exhaust hole 620. In other words, for example, as described in the drawing, in order to prevent two exhaust regions 610 facing each other from communicating with each other by passing through the exhaust hole 620, the hole partition wall 1W may be disposed in the middle of the interior of the exhaust hole 620 in a longitudinal direction such that the exhaust hole 620 is bisected.

If there is no hole partition wall 1W in the exhaust hole 620, a plurality of gas airflows in the plurality of exhaust regions 610 join in the exhaust hole 620. In this manner, when the plurality of gas airflows join, gas particles may collide with each other, and in the present disclosure, a hole partition wall 1W is disposed inside the exhaust hole 620 so that the exhaust hole 620 is divided to block such joining.

In other words, in the present disclosure, the hole partition wall 1W is disposed in the exhaust hole 620 to correspond to each of the plurality of gas airflows, and as an example, in one exhaust hole 620, one hole partition wall 1W may be disposed to correspond to two exhaust regions 610, as illustrated in the drawing.

Furthermore, the exhaust hole 620 may be formed so that an internal side surface 621 thereof becomes inclined toward the center of the exhaust hole 620 as it approaches an outlet direction of the exhaust hole 620.

The exhaust hole 620 may be disposed in a direction, perpendicular to a direction of the individual exhaust path 612*a* of the exhaust region 610, and in the structure condition, the internal side surface 621 of the exhaust hole 620 may be inclined to allow gas from the individual exhaust path 612*a* to flow smoothly into the exhaust hole 620.

That is, the internal side surface 621 of the exhaust hole 620 may be inclined toward the center of the exhaust hole 620 as it approaches the outlet direction of the exhaust hole 620, and accordingly, when the gas from the individual exhaust path 612*a* flows into the exhaust hole 620, it may change a direction obliquely rather than vertically. Accordingly, the gas from the individual exhaust path 612*a* may be smoothly introduced into the exhaust hole 620, thereby reducing the loss of the exhaust pressure.

Furthermore, an end 2Wa of the exhaust path partition wall 2W may protrude to the interior of the exhaust hole 620 and take a structure inclined in an opposite direction of the outlet of the exhaust hole 620. Specifically, as each end 2Wa of the plurality of exhaust path walls 2W protrudes toward the interior of the exhaust hole 620, a plurality of gas airflows introduced into the exhaust hole 620 from a plurality of individual exhaust paths 612*a* may be maintained for a predetermined period of time, and accordingly, even if the gas joins eventually in the exhaust hole 620, the occurrence of the eddy current may be minimized.

Furthermore, the end 2Wa of the exhaust path partition wall 2W may have a structure inclined in the opposite direction of the outlet of the exhaust hole 620 in addition to the condition of protruding to the interior of the exhaust hole 620. Among the gas airflows just introduced into the exhaust hole 620, the gas airflows at the outlet of the exhaust hole 620 (i.e., gas airflows in a lower side of the drawing) changes a direction to the outlet direction of the exhaust hole 620 without generating the eddy current, due to the inclined structure of the internal side surface 621 of the exhaust hole 620. On the other hand, the gas airflows (i.e., gas airflows in an upper side of the drawing) on the opposite side of the outlet of the exhaust hole 620 may generate relatively more eddy currents when changing a direction thereof. In consideration of the condition, the end 2Wa of the exhaust path partition wall 2W protrudes to the interior of the exhaust hole 620 and is simultaneously inclined in the opposite direction of the outlet of the exhaust hole 620, and accordingly, the plurality of gas airflows on the opposite side of the outlet of the exhaust hole 620 just introduced into the exhaust hole 620 from the plurality of individual exhaust paths 612*a* may be maintained for a predetermined period of time, thereby reducing the occurrence of the eddy current.

Meanwhile, the duct connection portion 611 may be formed so that an inlet 611*a* thereof is perpendicular to an outlet 611*b* thereof. In this case, a valve V having a guide inclined surface Vt for guiding a direction of the gas may be installed in a portion in which the inlet 611*a* and the outlet 611*b* of the duct connection portion 611 communicate with each other.

Specifically, the valve V is installed in the duct connection portion 611 and has the guide inclined surface Vt, and in this case, the guide inclined surface Vt is formed in the portion in which the inlet 611*a* and the outlet 611*b* communicate with each other inside the duct connection portion 611. In this manner, as the valve V has the guide inclined surface Vt for guiding the direction of the gas, the gas may smoothly change a direction without vertically colliding with an internal surface of the valve V When the gas changes a direction from the inlet 611*a* to the outlet 611*b*, thereby reducing the loss of the exhaust pressure. For reference, as the guide inclined surface Vt inside the valve V is rotated by the driving member Vm disposed at the bottom, the gas may flow to one of the two outlets formed in one duct connection portion 611, or to both outlets.

Furthermore, a cross-sectional area of the duct connection portion 611, a cross-sectional area of the individual exhaust path 612*a*, and a cross-sectional area of each divided portion of the exhaust hole 620, through which the gas flows in the integrated duct body DB, may be formed to sequentially increase. In this manner, a flow cross-sectional area of the gas gradually may increase in a direction of the gas flowing from the duct connection portion 611 to the exhaust hole 620, thereby reducing the loss of the exhaust pressure and stably exhausting the gas.

Accordingly, in the present disclosure, the hole partition wall 1W may be configured in the exhaust hole 620 communicating with the plurality of exhaust regions 610, and the plurality of exhaust regions 610 may be blocked from communicating with each other by passing through the exhaust hole 620, thereby stabilizing the internal pressure while minimizing the loss of the exhaust pressure.

Furthermore, according to the present invention, the exhaust path partition wall 2W may be disposed so that the plurality of individual exhaust paths 612*a* are formed in the common exhaust path 612 of the exhaust region 610, and the plurality of gas airflows from the plurality of duct connection portions 611 may flow individually in the plurality of individual exhaust paths 612*a* without joining in the common exhaust path 612, thereby stabilizing the internal pressure while reducing the loss of the exhaust pressure.

Although example embodiments of the present disclosure have been described with reference to the accompanying drawings, it will be understood by those skilled in the art that the present disclosure may be implemented in other specific forms without changing its technical concepts or essential features. Therefore, it should be understood that the example embodiments described above are exemplary and not limited in all respects.

What is claimed is:

1. An integrated exhaust duct comprising:

an integrated duct body having a plurality of exhaust regions and an exhaust hole communicating with the plurality of exhaust regions; and a hole partition wall disposed inside the exhaust hole to divide the exhaust hole so that the plurality of exhaust regions are blocked from communicating with each other in at least a portion of the exhaust hole, wherein the exhaust region includes a plurality of duct connection portions to which a plurality of exhaust ducts are connected, and a common exhaust path formed from the plurality of duct connection portions to the exhaust hole, wherein, in the common exhaust path, an exhaust path partition wall is disposed so that a plurality of individual exhaust paths are formed from the plurality of duct connection portions to the exhaust hole, wherein the exhaust hole has an internal side surface inclined toward a center direction of the exhaust hole as it approaches an outlet of the exhaust hole, and wherein an end of the exhaust path partition wall protrudes to an interior of the exhaust hole and is inclined in a direction, opposite to the outlet of the exhaust hole.

2. The integrated exhaust duct according to claim 1, wherein an outlet of each of the plurality of duct connection portions is formed in a direction different from a direction oriented to the exhaust hole, and the individual exhaust path is divided into a plurality of portions from the duct connection portion to the exhaust hole, wherein each of the plurality of portions extend straight, and each of a connection portion between the duct connection portion and the individual exhaust path and a connection portion between the plurality of portions is bent and a gap angle thereof is formed to be an obtuse angle.

3. The integrated exhaust duct according to claim 1, wherein an outlet of each of the plurality of duct connection portions is formed in a direction different from a direction oriented to the exhaust hole.

4. The integrated exhaust duct according to claim 1, wherein the duct connection portion is formed so that an inlet thereof is perpendicular to an outlet thereof, and a valve having a guide inclined surface for guiding a direction of gas is installed in a portion in which the inlet and the outlet of the duct connection portion communicate with each other.

5. The integrated exhaust duct according to claim 1, wherein a cross-sectional area of the duct connection portion, a cross-sectional area of the individual exhaust path, and a cross-sectional area of each divided portion of the exhaust hole, through which gas flows in the integrated duct body, are formed to sequentially increase.

6. The integrated exhaust duct according to claim 1, wherein two exhaust regions are formed as a set, and the two common exhaust paths of the two exhaust regions are disposed to correspond to each other with the exhaust hole interposed therebetween.

7. An integrated exhaust duct comprising:

an integrated duct body having a plurality of exhaust regions and an exhaust hole communicating with the plurality of exhaust regions; and a hole partition wall disposed inside the exhaust hole to divide the exhaust hole so that a plurality of exhaust regions are blocked from communicating with each other in at least a portion of the exhaust hole, wherein the exhaust region includes a plurality of duct connection portions to which a plurality of exhaust ducts are connected, and a common exhaust path formed from the plurality of duct connection portions to the exhaust hole, wherein the duct connection portion has two outlets formed in opposite directions, and the two exhaust holes are disposed to be spaced apart from each other, wherein the two common exhaust paths for connecting the two outlets and the two exhaust holes are disposed to correspond to each other with the duct connection portion interposed therebetween, and wherein in the common exhaust path, an exhaust path partition wall is disposed so that a plurality of individual exhaust paths are formed from the plurality of duct connection portions to the exhaust hole.

8. The integrated exhaust duct according to claim 7, wherein an outlet of each of the plurality of duct connection portions is formed in a direction different from a direction oriented to the exhaust hole, and the individual exhaust path is divided into a plurality of portions from the duct connection portion to the exhaust hole, wherein each of the plurality of portions extends straight, and each of a connection portion between the duct connection portion and the individual exhaust path and a connection portion between the plurality of portions is bent and a gap angle thereof is formed to be an obtuse angle.

9. The integrated exhaust duct according to claim 7, wherein an outlet of each of the plurality of duct connection portions is formed in a direction different from a direction oriented to the exhaust hole, and the individual exhaust path is curved from the duct connection portion to the exhaust hole.

10. The integrated exhaust duct according to claim 7, wherein the exhaust hole has an internal side surface inclined toward a center direction of the exhaust hole as it approaches an outlet of the exhaust hole.

11. The integrated exhaust duct according to claim 10, wherein an end of the exhaust path partition wall protrudes to an interior of the exhaust hole and is inclined in a direction, opposite to the outlet of the exhaust hole.

12. The integrated exhaust duct according to claim 7, wherein the duct connection portion is formed so that an inlet thereof is perpendicular to an outlet thereof, and a valve having a guide inclined surface for guiding a direction of gas is installed in a portion in which the inlet and the outlet of the duct connection portion communicate with each other.

13. The integrated exhaust duct according to claim 7, wherein a cross-sectional area of the duct connection portion, a cross-sectional area of the individual exhaust path, and a cross-sectional area of each divided portion of the exhaust hole, through which gas flows in the integrated duct body, are formed to sequentially increase.

14. The integrated exhaust duct according to claim 7, wherein two exhaust regions are formed as a set, and the two common exhaust paths of the two exhaust regions are disposed to correspond to each other with the exhaust hole interposed therebetween.

15. A substrate processing apparatus comprising:

a plurality of process chambers in which processes are performed on each substrate;

a plurality of exhaust ducts connected to a plurality of exhaust lines formed in the plurality of process chambers; and an integrated exhaust duct connected to the plurality of exhaust ducts, wherein the integrated exhaust duct comprises:

an integrated duct body having a plurality of exhaust regions and an exhaust hole communicating with the plurality of exhaust regions; and a hole partition wall disposed inside the exhaust hole to divide the exhaust hole so that the plurality of exhaust regions are blocked from communicating with each other in at least a portion of the exhaust hole, wherein the exhaust region includes a plurality of duct connection portions to which a plurality of exhaust ducts are connected, and a common exhaust path formed from the plurality of duct connection portions to the exhaust hole, wherein in the common exhaust path, an exhaust path partition wall is disposed so that a plurality of individual exhaust paths are formed from the plurality of duct connection portions to the exhaust hole, wherein the exhaust hole has an internal side surface inclined toward a center direction of the exhaust hole as it approaches an outlet of the exhaust hole, and wherein an end of the exhaust path partition wall protrudes to an interior of the exhaust hole and is inclined in a direction, opposite to the outlet of the exhaust hole.

16. The substrate processing apparatus according to claim 15, wherein an outlet of each of the plurality of duct connection portions is formed in a direction different from a direction oriented to the exhaust hole, and the individual exhaust path is divided into a plurality of portions from the duct connection portion to the exhaust hole, wherein each of the plurality of portions extend straight, and each of a connection portion between the duct connection portion and the individual exhaust path and a connection portion between the plurality of portions is bent and a gap angle thereof is formed to be an obtuse angle.

17. The substrate processing apparatus according to claim 15, wherein an outlet of each of the plurality of duct connection portions is formed in a direction different from a direction oriented to the exhaust hole.

18. The substrate processing apparatus according to claim 15, wherein the duct connection portion is formed so that an inlet thereof is perpendicular to an outlet thereof, and a valve having a guide inclined surface for guiding a direction of gas is installed in a portion in which the inlet and the outlet of the duct connection portion communicate with each other.

19. The substrate processing apparatus according to claim 15, wherein a cross-sectional area of the duct connection portion, a cross-sectional area of the individual exhaust path, and a cross-sectional area of each divided portion of the exhaust hole, through which gas flows in the integrated duct body, are formed to sequentially increase.

20. The substrate processing apparatus according to claim 15, wherein two exhaust regions are formed as a set, and the two common exhaust paths of the two exhaust regions are disposed to correspond to each other with the exhaust hole interposed therebetween.

* * * * *